United States Patent [19]

Hansz

[11] Patent Number: 5,285,046
[45] Date of Patent: Feb. 8, 1994

[54] APPARATUS FOR DEPOSITING PARTICULATE OR POWDER-LIKE MATERIAL ON THE SURFACE OF A SUBSTRATE

[75] Inventor: Bernard Hansz, Vert le Pett, France
[73] Assignee: Plasma-Technik AG, Wohlen, Switzerland
[21] Appl. No.: 725,693
[22] Filed: Jul. 3, 1991
[30] Foreign Application Priority Data
  Jul. 3, 1990 [DE] Fed. Rep. of Germany ....... 4021182
[51] Int. Cl.⁵ .............................................. B23K 9/00
[52] U.S. Cl. ............................. 219/121.47; 219/121.52; 219/76.16; 219/121.48; 315/111.51; 427/446
[58] Field of Search .................. 219/121.47, 121.59, 219/121.36, 76.16; 315/111.21, 111.51; 427/34, 39

[56] References Cited
U.S. PATENT DOCUMENTS

| | | | |
|---|---|---|---|
| 2,919,370 | 12/1959 | Giannini et al. | 219/121.52 |
| 3,296,410 | 1/1967 | Hedger | 219/121.52 |
| 3,596,040 | 7/1971 | MacDonald et al. | 219/76.16 |
| 4,766,287 | 8/1988 | Morrisroe et al. | 219/121.52 |
| 5,159,173 | 10/1992 | Frind et al. | 219/121.47 |

Primary Examiner—Mark H. Paschall
Attorney, Agent, or Firm—Dykema Gossett

[57] ABSTRACT

The invention provides an apparatus for depositing particulate or powder-like material on the surface of a substrate. The apparatus comprises a hollow tube-like chamber consisting of a heat-resistant material, in which a plasma torch is generated. By means of a device for supplying solid particulate or powder-like material, the material is molten in the plasma torch and deposited on the surface of the substrate. In order to achieve a uniform temperature distribution in the plasma torch, the apparatus comprises at least two induction coils located at the outer surface of the hollow tube-like member and a high frequency generator means having at least two generator sections. A first of the at least two generator sections generates energy with a first higher frequency and a second of the at least two generator sections generates energy with a second lower frequency. One of said at least two induction coils are connected to the first generator section and another one of the at least two induction coils are connected to the second generator section.

11 Claims, 2 Drawing Sheets

APPARATUS FOR DEPOSITING PARTICULATE OR POWDER-LIKE MATERIAL ON THE SURFACE OF A SUBSTRATE

BACKGROUND OF THE INVENTION

The present invention refers to an apparatus for depositing particulate or powder-like material on the surface of a substrate, said apparatus comprising a hollow tube-like chamber consisting of a heat-resistant material, said tube-like chamber having a first and a second end, means for supplying solid particulate or powder-like material into said tube-like chamber at said first end, means for supplying a plasma gas into said tube-like chamber at said first end, and means for generating a plasma torch in the interior of said hollow tube-like chamber including ignition means for the ignition of said plasma torch.

In order to provide the surface of a substrate with a coating of particulate or powder-like material, so-called plasma coating devices are known in the art for several years. Thereby, in such devices, a metallic or ceramic powder material is blown into a plasma torch and, therein, heated up to a very high temperature. The powder material is molten and accelerated in the plasma torch and is finally thrown towards the surface of the substrate to be coated with very high speed.

There is a first category of industrially used plasma torch coating devices. These devices are powered with direct current whereby there is provided a pair of electrodes connected to a direct current power supply. A plasma gas jet is blown into the space between the two electrodes and, after an initial ignition process, is ionized therebetween in order to provide a plasma torch. The temperatures in the interior of the plasma torch are very high, i.e. sufficiently high to melt a particulate or powder-like metallic or ceramic coating material which is blown into said plasma torch.

A common characteristic of these direct current plasma coating devices is that the particulate or powder-like material is blown into the plasma torch, that it is thereby molten and that it is accelerated to a relatively high speed before it hits the surface of the substrate to be coated. The maximal speed and the maximal temperature of the particulate or powder-like coating material thereby depends on the characteristics of the plasma torch. The direct current plasma coating devices known in the art are in a position to provide an escape speed of the coating material in the region of about 100 to 300 m/s; however, the outlet cross section is relatively small. The consequence is that a long time is required to coat the surface of a large substrate. Thus, such devices are more preferred for the coating of small substrates.

Another possibility for the generation of a plasma torch is to inductively supply power to the plasma gas in order to create a high energy plasma torch, of course after an initial ignition process. For this purpose, there is provided a hollow tube-like chamber consisting of a heat-resistant material, said tube-like chamber having a first and a second end, means for supplying solid particulate or powder-like material into the tube-like chamber at said first end, means for supplying a plasma gas into said tube-like chamber at said first end, and an induction coil powered by a high frequency generator located at said second end for generating a plasma torch in the interior of the hollow tube-like chamber. Such an apparatus, however, is not in a position to provide a particularly high escape speed of the molten particulate coating material, but the usable outlet cross section, compared with a direct current plasma torch coating device as discussed hereinabove, is much greater. Thus, such a inductively coupled plasma coating device is much better suited for the coating of the surface of large substrates.

The U.S. Pat. No. 4,853,250 discloses a method of depositing particulate material on a substrate. The apparatus used therefor is based on a conventional inductively coupled plasma torch coating device. However, the disclosure of the above mentioned Patent shows a way to increase the escape velocitiy of the particulate material molten in the plasma torch, as compared to similar devices known in the art. It is known that usual inductively coupled plasma coating devices can reach an escape velocity of approximately 10 to 30 m/s, while the apparatus described in the above mentioned Patent enables the molten coating material with a velocity of approximately 100 m/s or even more.

A great disadvantage, however, is common to both the conventional inductively coupled plasma coating devices and to the device according to the above mentioned Patent: The temperature distribution over the cross-section of the apparatus, particularly over the cross section of the hollow tube-like chamber in which the plasma torch is present and which is initiated and maintained by means of an induction coil, is not very uniform. With other words: In the region of a wall of the hollow tube-like chamber, the temperature of the plasma torch is substantially higher, continuously decreases towards the center of the tube-like chamber and, thereafter, increases again towards the opposite chamber of the tube-like chamber.

It is understood that these characteristics are not desired because the uniformity of the coating of the substrate is impaired and because the time required to coat a substrate of considerable size is increased.

A further disadvantage of an apparatus of the kind discussed hereinabove, i.e. inductively coupled plasma torch coating devices, is that the high frequency generator unit required to power the induction coil has to provide a relatively high amount of energy to maintain a plasma torch having the desired shape and intensity. It is known to every person skilled in the art that a device of the aforementioned kind requires a power supply which must be able to provide an energy in the region of 25 to 150 kW with a frequency of some MHz; thus, it is important to design the real coating device, i.e. the heat-resistant tube-like member with the integrated induction coil as well as the high frequency generator, either as a single unit or to take measures that the high frequency generator is not too far from the real coating device because the transmission of high energy in the region of several dozens of kW at a frequency of several MHz poses severe problems.

OBJECTS OF THE INVENTION

It is an object of the present invention to provide an apparatus for depositing particulate or powder-like material on the surface of a substrate which avoids the aforementioned disadvantages.

Particularly, it is an object of the invention to provide an apparatus for depositing particulate or powder-like material on the surface of a substrate in which the temperature distribution over the cross section of the tube-like chamber is much more uniform.

It is a still further object of the invention to provide an apparatus for depositing particulate or powder-like material on the surface of a substrate in which the transmission of the energy from the high frequency generator to the induction coil presents less problems, i.e. in which it is possible to transmit the energy over even considerably long distances.

SUMMARY OF THE INVENTION

In order to meet these and other objects, the invention provides an apparatus for depositing particulate or powder-like material on the surface of a substrate. The apparatus comprises a hollow tube-like member consisting of a heat-resistant material, said tube-like member having a first and a second end.

Further, there are provided means for supplying solid particulate or powder-like material into the tube-like member at said first end, means for supplying a plasma gas into the tube-like member at said first end, and means for generating a plasma torch in the interior of the hollow tube-like member including ignition means for the ignition of the plasma torch.

The means for generating a plasma torch comprise at least two induction coils located at the outer surface of the hollow tube-like member at said second end and a high frequency generator means having at least two generator sections, a first of said at least two generator sections generating energy with a first higher frequency and a second of said at least two generator sections generating energy with a second lower frequency, whereby one of said at least two induction coils being connected to said first generator section and another one of said at least two induction coils being connected to said second generator sections.

Usually, it will be sufficient to provide two induction coils, located side by side in axial direction of the hollow tube-like member. It is understood that, within the scope of the present invention, it is possible to provide three or more induction coils which are located side by side in axial direction of the hollow tube-like member in order to realize an even more uniform temperature distribution over the cross section of the tube-like member.

According to a preferred embodiment, a first of said two induction coils is located in the region of the outlet of said means for supplying solid particulate or powder-like material into said tube like member and in which a second of said two induction coils is located adjacent to said first induction coil in the region of said second end of said hollow tube-like member.

Preferably, one of said at least two induction coils is powered with at least twice the frequency than another one of said at least two induction coils. More preferably, experience has shown that one of said at least two induction coils should be powered with a frequency of between 1 to 10 MHz, preferably with a frequency of between 2 to 5 MHz, and another one of said at least two induction coils should be powered with a frequency of between 20 to 500 kHz, preferably with a frequency of between 50 to 200 kHz.

In the interest of an optimal operation of the apparatus of the invention, as far as the efficiency is concerned, the following point should be observed:

As the physical location of the two induction coils on the heat-resistant tube-like member is given and fixed and because both coils are similar, measures should be taken to optimally match the two coils to the high frequency generator section, particularly with regard to the output frequency of the high frequency generator sections. Thus, it is advisable that the induction coils comprise a capacitor connected in parallel with the assigned induction coil, whereby the capacitance of each capacitor connected in parallel with the assigned induction coil is such that the resonance frequency resulting from the capacitance of the capacitor and inductivity of the induction coil equals the power supply frequency of the generator section to which the capacitor-induction coil-circuitry is connected.

In the most simple case of the invention in which a first of the two induction coils is located in the region of the outlet of the means for supplying solid particulate or powder-like material into the tube like member, this coil is powered with less energy than the second of the two induction coils located adjacent to the first induction coil in the region of the second end of the hollow tube-like member. Preferably, the ratio of the energy fed to the first and the second induction coil is between 0.6:1 and 0.9:1, more preferably between 0.8:1 and 0.9:1.

Surprisingly, it has shown that the sum of the power consumption of the two coils is less than the power consumption of one single induction coil according to the prior art, supposing that a desired plasma torch of predetermined size and power has to be maintained. In order to optimally adjust the efficiency, it is desirable that the means for supplying solid particulate or powder-like material into the tube-like member comprises a supply tube member arranged coaxially to the tube-like member and having substantially less diameter than the tube-like member, whereby the supply tube member is axially displaceably mounted in the interior of the tube-like member.

BRIEF DESCRIPTION OF THE DRAWINGS

In the following, an embodiment of the apparatus for depositing particulate material on the surface of a substrate will be further described, with reference to the accompanying drawings, in which.

DETAILED DESCRIPTION OF THE PREFERRED EMBODIMENT

Figure 1:
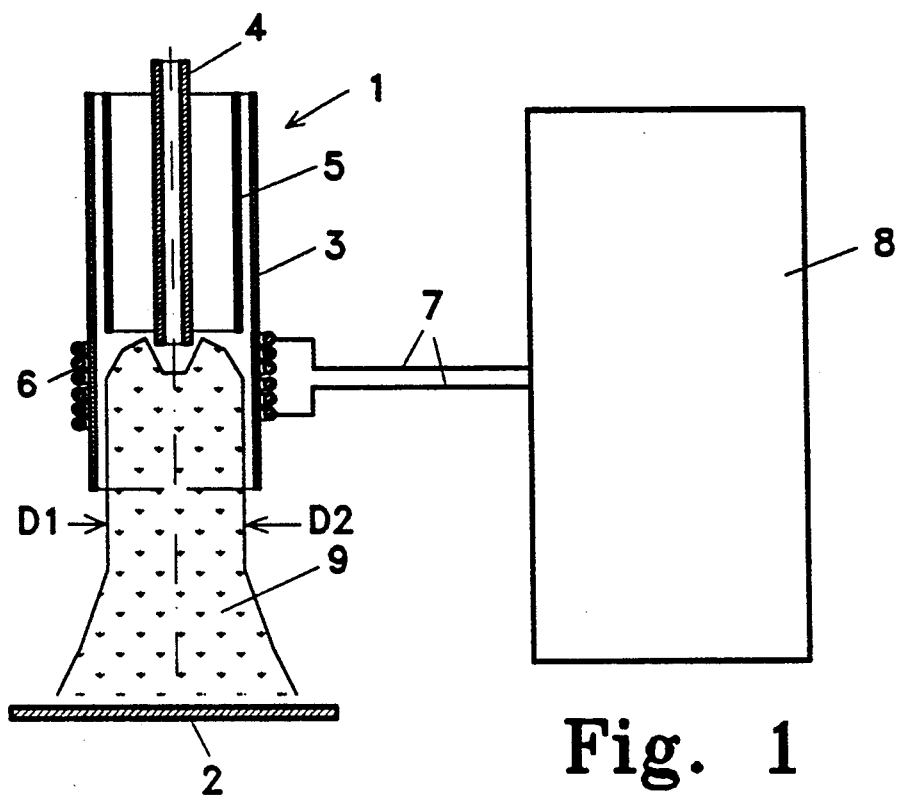
FIG. 1 shows a schematic axial sectional view of the essential parts of an apparatus for depositing particulate material on the surface of a substrate having inductive coupling means for supplying energy in order to maintain a plasma torch according to the prior art.

In FIG. 1, there is shown an apparatus for depositing particulate material on the surface of a substrate, generally designated with reference numeral 1, according to the prior art. The apparatus 1 is adapted to deposit particulate material on the surface of a substrate 2. The apparatus 1 for depositing particulate material on the surface of a substrate 2 comprises a heat-resistant tube-like body 3 which can, for example, consist of quartz glass. In the interior of the tube-like body 3, there is provided a means for supplying the particulate depositing material; this means can have the form of a tube 4 through which a powder material and a carrier gas is blown into the interior of the tube-like member 3. A further tube-like member 5 is provided and concentrically arranged in the interior of the tube-like member 3. The tube-like member 5 has slightly smaller diameter than the tube-like member 3 whereby a sheat gas can be blown into the apparatus through the space between the tube-like member 3 and the tube-like member 5.

The tube-like member 3 is provided with an induction coil 6 arranged in the region of the outlet of the supply means for the particulate material. The induction coil 6 is connected to a high frequency generator 8 via conductors 8.

The high frequency generator 8 provides energy in the amount of between 50 and 250 kW with a frequency of between 2 to 4 MHz. If this energy is fed via the conductors 7 to the coil 6, and if a suitable inert gas, e.g. argon, is blown into the space between the powder supply tube 4 and the tube-like member 5, and after a suitable ignition, a plasma torch 9 will be generated in the region of the lower end of the tube-like member 3. The particulate or powder material is blown into the tube-like member 3 and, thereby into the plasma torch 9 through the supply tube 4 by means of a carrier gas.

The means for supplying the particulate depositing material and the carrier gas, the means for supplying the plasma gas and the means for the ignition of the plasma torch are not shown in the drawings and need not to be further explained since they are well known to any person skilled in this art.

Due to the fact that very high temperatures exist in the plasma torch 9, the particulate or powder material blown into the tube-like member 3 is instantaneously molten and accelerated to a very high speed. The molten particulate or powder material is thrown in its molten state with high speed to the surface of the substrate 2 to be coated.

Figure 3:
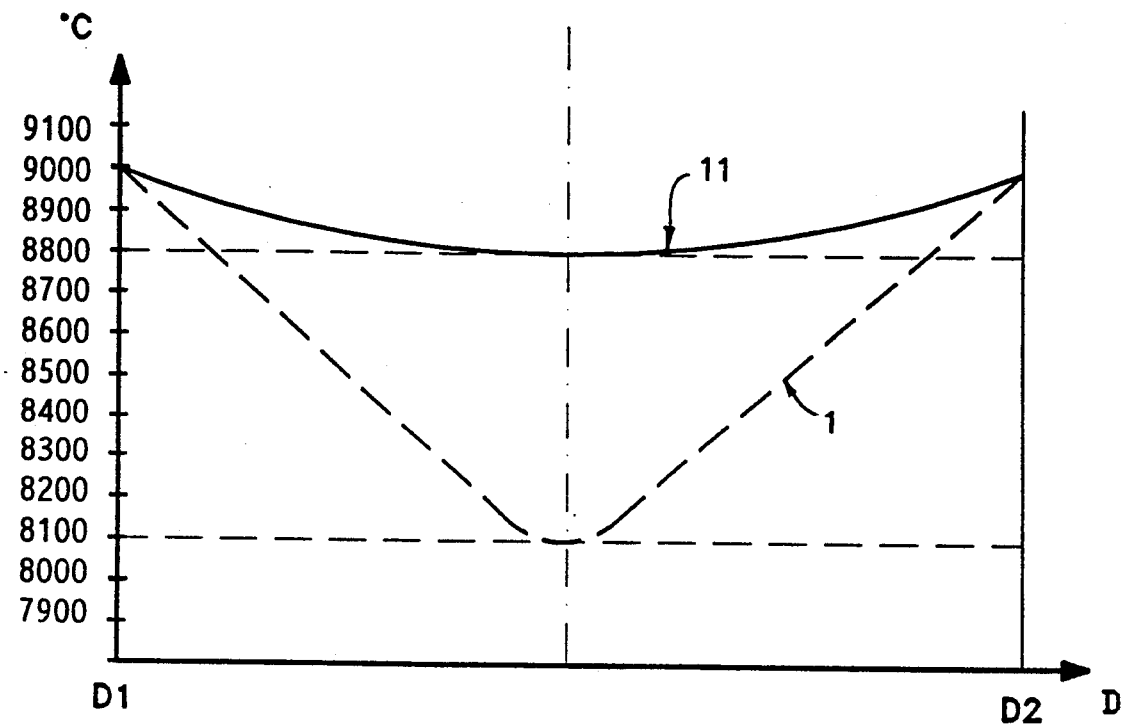
FIG. 3 shows a temperature diagram.

According to FIG. 3, the dashed curve (FIG. 1) shows the temperature distribution over the cross sectional area $D_1$-$D_2$ of the tube-like member 3. Thereby, it is evident that the temperature in the region of the walls of the tube-like member 3 is considerably higher, i.e. in the region of approximately 9000° C., while it decreases continuously to a value of approximately 8000° C. in the region of the central axis of the tube-like member 3. This situation, generally, is not desirable because the particulate or powder material to be molten in the plasma torch 9 is not evenly molten with the result that the quality of the coating on the surface of the substrate 2 is not uniform.

Figure 2:
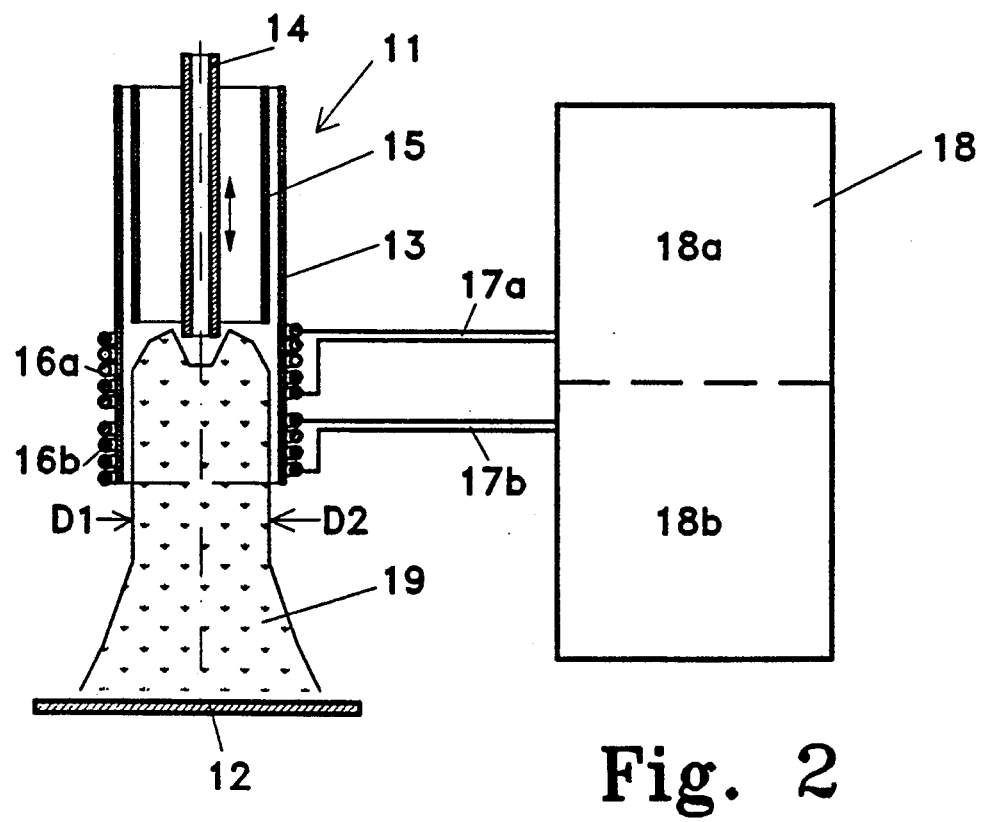
FIG. 2 shows a schematic axial sectional view of the essential parts of an apparatus for depositing particulate material on the surface of a substrate having inductive coupling means for supplying energy in order to maintain a plasma torch according to the invention.

The solution according to the invention is schematically shown in FIG. 2. The apparatus for depositing particulate material on the surface of a substrate is generally designated with reference numeral 11 and the substrate to be coated with reference numeral 12. The general design of the apparatus according to the invention and shown in FIG. 2 is similar to that shown in FIG. 1 and discussed hereinabove. It comprises a heat-resistant tube-like body 13 which can, for example, consist of quartz glass. In the interior of the tube-like body 13, there is provided a means for supplying the particulate depositing material; this means can have the form of a tube 14 through which a powder material and a carrier gas is blown into the interior of the tube-like member 13. A further tube-like member 15 is provided and concentrically arranged in the interior of the tube-like member 13. The tube-like member 15 has slightly smaller diameter than the tube-like member 13 whereby a sheat gas can be blown into the apparatus through the space between the tube-like member 13 and the tube-like member 15.

In contrast to the embodiment shown in FIG. 1 and discussed hereinabove, the apparatus 11 shown in FIG. 2 comprises two induction coils 16a and 16b located one besides the other one, seen in axial direction of the tube-like body member 13. Further, there is provided a twin high frequency generator unit 18. A section 18a of the high frequency generator unit 18 is connected to the induction coil 16a via the conductors 17a, and a section 18b of the high frequency generator unit 18 is connected to the induction coil 16b via the conductors 17b. The energy and the frequency delivered by the section 18a of the high frequency generator unit 18 differs from the energy and the frequency delivered by the section 18b of the high frequency generator unit 18.

According to the embodiment shown in FIG. 2, two induction coils 16a and 16b are provided which are located side by side in axial direction on the outer surface of the tube-like member 13. According to the invention, it is essential that at least two induction coils are provided. However, it should be pointed out that it is within the scope of the invention to provide three or more induction coils located side by side in axial direction of the tube-like member 13, if necessary, whereby at least two of these induction coils are connected to a high frequency power supply having different energy and frequency ratings.

In the present example, the first induction coil 16a which is located in the region of the outlet of the coating material outlet tube 14 is powered with a higher frequency than the second induction coil 16b which is located in the region of the outlet of the tube-like member 13. Preferably, the said first induction coil 16a is powered with a frequency of between 1 and 10 MHz, preferably between 2 and 5 MHz, and the said second induction coil 16b is powered with a frequency of between 20 and 500 kHz, preferably between 50 and 200 kHz.

Surprisingly, it has been found that first induction coil 16a, i.e. the coil which is located in the region of the outlet of the powder supply tube 14 and which is powered with the higher frequency, has to be supplied with less energy than the axially adjacent second induction coil 16b which is powered with the lower frequency. Thereby, the ratio of power consumption of the two induction coils 16a and 16b is in the region of between 0.6:1 and 0.9:1, preferably in the region of approximately 0.85:1.

Even more surprising is the fact that the total power consumption of the two induction coils 16a and 16b required to maintain a predetermined and desired plasma torch is considerably lower when the said two coils 16a and 16b are powered with different frequencies as explained hereinabove as compared to the power consumption of a single induction coil according to the prior art (cf. FIG. 1) which is powered with a frequency between 2 and 5 MHz.

Figure 4:
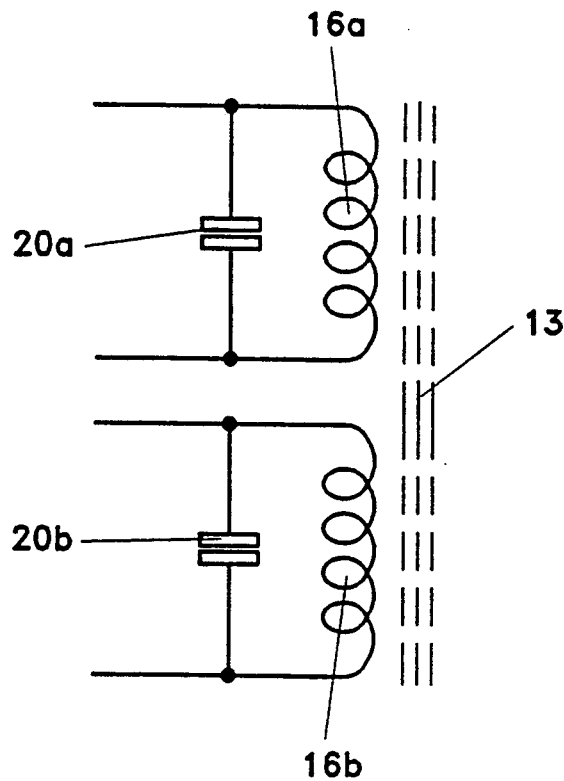
FIG. 4 shows a detail of the electric circuitry of the apparatus according to FIG. 2.

As the two induction coils 16a and 16b generally have similar physical configuration and, consequently, have similar inductivity, further in view of the fact that the two induction coils are powered with clearly different frequencies, it is advisable to provide some sort of electric matching in order to improve the overall electric efficiency. For this purpose, the invention provides the measure that a first capacitor 20a is connected in parallel with the coil 16a and that a second capacitor 20b is connected in parallel with the coil 16b, as can be schematically seen from FIG. 4. Thereby, the capacity of the first capacitor 20a is chosen such that the resonance frequency resulting from the inductivity of the coil 16a and from the capacity of the first capacitor 20a is equal to the output frequency of the section 18a of the high frequency power supply unit 18. Similarly, the capacity of the second capacitor 20b is chosen such that the resonance frequency resulting from the inductivity of the coil 16b and from the capacity of the second capacitor 20b is equal to the output frequency of the section 18b of the high frequency power supply unit 18. The result is that both coils 16a and 16b are optimally inductively coupled to the power supply circuit.

In order to further optimize the design of the apparatus schematically shown in FIG. 2, the invention provides for the measure that the tube 14 for the supply of the particulate or powder material is axially displaceable as shown by the double-arrow in FIG. 2. Thereby, the plasma torch 19 can be brought into an optimal position between the two induction coils 16a and 16b.

One important advantage of the apparatus according to the invention is that the temperature distribution over the cross section of the tube-like member 13 is much more uniform than with an apparatus according to the prior art. Particularly, as can be seen from FIG. 3, in contrast to the design of the apparatus of the prior art shown in FIG. 1, the temperature of the plasma torch in the region of the walls of the tube-like member 13 is also in the region of approximately 9000° C., but that the temperature of the plasma torch in the center of the tube-like member 13 decreases only to about 8800° C. as can be seen in the diagram according to FIG. 3 from the solid line (FIG. 2). With other words, in an apparatus according to the prior art, one has a temperature difference between wall region and central region of about 1000° C., while in an apparatus according to the invention, there is a temperature difference between the wall region and the central region of only about 200° C. The result is that the quality of the coating on the surface of a substrate is much more uniform when using an apparatus of the invention than when using an apparatus according to the prior art.

A further advantage of the apparatus according to the invention is that a much smaller amount of energy has to be transmitted over the conductors 17a between generator section 18a and coil 16a and over the conductors 17b between generator section 18b and coil 16b than over the conductors 7 between the generator 8 and the coil 6 of the apparatus according to the prior art as shown in FIG. 1. As is well known to any person skilled in the art, the transmission of high frequency energy with a considerable amount over long distances poses much problems, the advantage of the apparatus of the invention is that the generator unit 18 can be located distantly from the coating apparatus 11 without the occurrence of these problems; consequently, the real coating apparatus is much more mobile.

A final but nevertheless important advantage of the apparatus of the invention is that the total energy consumption, with a given plasma torch and compared to a conventional apparatus as, e.g., shown in FIG. 1, is substantially lower; depending on the practical design of the apparatus of the invention, experience has shown that an energy saving of up to 40% can be realized.

What is claimed is:

1. An apparatus for depositing particulate or powder-like material on the surface of a substrate, said apparatus comprising:

a hollow tube-like member consisting of a heat-resistant material, said tube-like member having a first and a second end;

means for supplying solid particulate or powder-like material into said tube-like member at said first end;

means for supplying a plasma gas into said tube-like member at said first end;

means for generating a plasma in the interior of said hollow tube-like member including ignition means for the ignition of said plasma torch;

said means for generating a plasma torch comprising at least two induction coils located at the outer surface of said hollow tube-like member at said second end and a high frequency generator means having at least two generator sections, a first of said at least two generator sections generating energy with a first higher frequency and a second of said at least two generator sections generating energy with a second lower frequency;

one of said at least two induction coils being connected to said first generator section and another one of said at least two induction coils being connected to said second generator section.

2. An apparatus according to claim 1 in which two induction coils are provided, located side by side in axial direction of said hollow tube-like member.

3. An apparatus according to claim 2 in which a first of said two induction coils is located in the region of the outlet of said means for supplying solid particulate or powder-like material into said tube like member and in which a second of said two induction coils is located adjacent to said first induction coil in the region of said second end of said hollow tube-like member.

4. An apparatus according to claim 1 in which one of said at least two induction coils is powered with at least twice the frequency than another one of said at least two induction coils.

5. An apparatus according to claim 4 in which one of said at least two induction coils is powered with a frequency of between 1 to 10 MHz, preferably with a frequency of between 2 to 5 MHz, and in which another one of said at least two induction coils is powered with a frequency of between 20 to 500 kHz, preferably with a frequency of between 50 to 200 kHz.

6. An apparatus according to claim 1 in which one of said at least two induction coils located in the region of the outlet of said means for supplying solid particulate or powder-like material into said tube like member is powered with a higher frequency than another one of said at least two induction coils.

7. An apparatus according to claim 1 in which each of said induction coils comprises a capacitor connected in parallel with the assigned induction coil.

8. An apparatus according to claim 7 in which the capacitance of each capacitor connected in parallel with the assigned induction coil is such that the resonance frequency resulting from the capacitance of the capacitor and inductivity of the induction coil equals the power supply frequency of the generator section to which the capacitor-induction coil-circuitry is connected.

9. An apparatus according to claim 3 in which said first of said two induction coils located in the region of the outlet of said means for supplying solid particulate or powder-like material into said tube like member is powered with less energy than said second of said two induction coils located adjacent to said first induction coil in the region of said second end of said hollow tube-like member.

10. An apparatus according to claim 9 in which the ratio of the energy fed to said first and said second induction coil is between 0.6:1 and 0.9:1, preferably between 0.8:1 and 0.9:1.

11. An apparatus according to claim 1 in which said means for supplying solid particulate or powder-like material into said tube-like member comprises a supply tube member arranged coaxially to said tube-like member and having substantially less diameter than said tube-like member, said supply tube member being axially displaceably mounted in the interior of said tube-like member.

* * * * *